US008420166B2

(12) United States Patent
Chen et al.

(10) Patent No.: US 8,420,166 B2
(45) Date of Patent: Apr. 16, 2013

(54) METHOD FOR PREPARING PATTERNED METAL OXIDE LAYER OR PATTERNED METAL LAYER BY USING SOLUTION TYPE PRECURSOR OR SOL-GEL PRECURSOR

(75) Inventors: Sun-Zen Chen, Hsinchu (TW);
Wen-Feng Kuo, Hsinchu (TW);
Ruo-Ying Wu, Hsinchu (TW);
Yu-Cheng Tzeng, Hsinchu (TW);
Ching-Wen Chang, Hsinchu (TW);
Hong-Jum Tan, Hsinchu (TW)

(73) Assignee: National Tsing Hua University, Hsinchu (TV)

( * ) Notice: Subject to any disclaimer, the term of this patent is extended or adjusted under 35 U.S.C. 154(b) by 265 days.

(21) Appl. No.: 12/659,834

(22) Filed: Mar. 23, 2010

(65) Prior Publication Data
US 2011/0156320 A1    Jun. 30, 2011

(30) Foreign Application Priority Data
Dec. 31, 2009   (TW) .............................. 98146293 A

(51) Int. Cl.
*B05D 3/02*    (2006.01)
*B05D 5/06*    (2006.01)

(52) U.S. Cl.
USPC .............................. 427/229; 427/226; 427/74

(58) Field of Classification Search .................. 427/74, 427/226, 229
See application file for complete search history.

(56) References Cited

U.S. PATENT DOCUMENTS

| 7,994,053 B2 * | 8/2011 | Park et al. ...................... 438/669 |
| 2006/0054507 A1 * | 3/2006 | Imada et al. ................... 205/206 |
| 2009/0098340 A1 * | 4/2009 | Campos et al. ............... 428/156 |

FOREIGN PATENT DOCUMENTS

| TW | 200938551 A | 9/2009 |
| TW | 200940567 A | 10/2009 |

OTHER PUBLICATIONS

Yau-Chyr Wang,Chien-Chow Chen,Yu-Hwe Lee,C.C. Chang, Study the Photochromic Effect of TiO2/Ag Thin Film, WHAMPOA—An Interdisciplinary Journal, 2007, p. 1-8.

* cited by examiner

*Primary Examiner* — Michael Cleveland
*Assistant Examiner* — Robert Vetere
(74) *Attorney, Agent, or Firm* — Bacon & Thomas, PLLC

(57) ABSTRACT

Methods for preparing a patterned metal/metal oxide layer by using a solution type precursor or sol-gel precursor are provided and, especially, a method for preparing a patterned carrier transport of a solar cell and a method for preparing biomedical material are provided, which comprise the following steps: (A) providing a substrate, and a mold with designed patterns formed thereon; (B) coating the substrate with a solution of a precursor to form a precursor layer, wherein the precursor is a metal precursor or a metal oxide precursor; (C) pressing the mold together with the precursor layer to transfer the patterns of the mold onto the precursor layer; (D) curing or pre-curing the precursor layer; (E) removing the mold; and (F) conducting an optional post-treatment, if it being demanded, to further modify the properties of precursor layer.

14 Claims, 2 Drawing Sheets

(A)

(B)

(C)

(A)

(B)

(C)

METHOD FOR PREPARING PATTERNED METAL OXIDE LAYER OR PATTERNED METAL LAYER BY USING SOLUTION TYPE PRECURSOR OR SOL-GEL PRECURSOR

BACKGROUND OF THE INVENTION

1. Field of the Invention

The present invention relates to a method for preparing a patterned metal oxide layer or a patterned metal layer by using a solution of a metal oxide precursor or a metal precursor and, more particularly, to a method for preparing a patterned carrier transport layer of a solar cell or a patterned biomedical material.

2. Description of Related Art

Currently, the patterning methods used to form nano-patterns can be e-beam lithography, ion-beam lithography, DUV (deep ultraviolet)/EUV (extreme ultraviolet) photolithography, soft X-ray lithography, and nanoimprint lithography. Among the aforementioned patterning techniques, the nanoimprint technique has advantages of high resolution, high throughput, and low cost, so it is widely applied in various fields.

The dye-sensitized solar cell has the advantages of simple processing and low production cost, and can be formed on a flexible substrate, so, many researches have been undertaken to improve the photoelectric conversion efficiency of the dye-sensitized solar cell, in order to apply the dye-sensitized solar cell into various fields. In the structure of the dye-sensitized solar cell, a $TiO_2$ layer on the electrode has good electron conductivity. Hence, after dyes absorb light and transfer photons into charges, the $TiO_2$ layer can increase the probability of transporting the charge to an external circuit, and thereby the photoelectric conversion efficiency of the dye-sensitized solar cell can be improved. However, the structure and the morphology of the $TiO_2$ layer may influence the transport of the electrons, and may further influence the photoelectric conversion efficiency of the dye-sensitized solar cell.

The nano-scaled $TiO_2$ possesses large surface-to-volume ratio, and the photoelectric conversion efficiency of the dye-sensitized solar cell can be improved when the nano-scaled $TiO_2$ is used. Hence, various types of nano-scaled $TiO_2$ have been developed, such as $TiO_2$ nanoparticles, $TiO_2$ carbon nanotubes, and $TiO_2$ nanocrystals. The spin-coated $TiO_2$ nanoparticle layer just has a plane-structure. If the plane-structure of the $TiO_2$ nanoparticle layer can be patterned to form 3D structure, the reaction areas of the $TiO_2$ layer can be increased, and the photoelectric conversion efficiency of the dye-sensitized solar cell can also be improved.

In addition, titanium and an alloy thereof have excellent biocompatibility and have been widely applied to biomedical researches and bio-implants such as bone plates and bone screws. Furthermore, $TiO_2$ not only can be used as anti-bacterial material, but also can be applied to medical treatments, such as angiopathy treatments.

In order to increase the reactivity of the implants, a sand-blasting process can be performed to roughen the surfaces of the bio-implants. However, the roughness of the surfaces cannot be controlled properly when the sandblasting process is performed. Hence, it is desirable to provide a method for forming patterns on the surfaces of the bio-implants to control the roughness and the morphology of the surfaces, and wherein it is possible to increase the bioactivity of the implants through the designed patterns.

SUMMARY OF THE INVENTION

The object of the present invention is to provide a method for preparing a patterned carrier transport layer of a solar cell, to increase the photoelectric conversion efficiency of a dye-sensitized solar cell.

Another object of the present invention is to provide a method for preparing a biomedical material, to increase the reaction surface of the biomedical material and thereby increase the reactivity of the biomedical material.

To achieve the aforementioned objects, the present invention provides a method for preparing a patterned carrier transport layer of a solar cell, which comprises the following steps: (A) providing a substrate, and a mold with designed patterns formed thereon; (B) coating the substrate with a solution of a precursor to form a precursor layer, wherein the precursor is a metal precursor, or a metal oxide precursor; (C) pressing the mold onto the precursor layer to transfer the designed patterns from the mold to the precursor layer; (D) curing/pre-curing the precursor layer; and (E) removing the mold to obtain a patterned carrier transport layer, wherein the patterned carrier transport layer is a patterned metal layer, or a patterned metal oxide layer.

In addition, when the patterned carrier transport layer is a patterned metal layer, the method of present invention may further comprise a step (F) after the step (E): modifying the patterned metal layer to further change its characteristics, such as structure, conductivity, transparency etc., or to form a patterned metal oxide layer, if it is needed. Moreover, when the patterned carrier transport layer is a patterned metal oxide layer, the method of the present invention may further comprise a step (F') after the step (E): modifying the patterned metal oxide layer to further change its characteristics, such as structure, conductivity, transparency etc., or to form a patterned metal layer, if it is needed.

In addition, the present invention provides a method for preparing a biomedical material, which comprises the following steps: (A) providing a substrate, and a mold with designed patterns formed thereon; (B) coating the substrate with a solution of a precursor to form a precursor layer, wherein the precursor is a metal precursor, or a metal oxide precursor; (C) pressing the mold onto the precursor layer to transfer the designed patterns from the mold to the precursor layer; (D) curing/pre-curing the precursor layer; and (E) removing the mold to obtain a patterned layer, wherein the patterned layer is a patterned metal layer, or a patterned metal oxide layer.

In addition, according to the method for preparing the biomedical material of the present invention, when the patterned layer is a patterned metal layer, the method for preparing a biomedical material of the present invention may further comprise a step (F) after the step (E): modifying the patterned metal layer to further change its characteristics, such as structure, conductivity, transparency etc., or to form a patterned metal oxide layer, if it is needed. Moreover, when the patterned layer is a patterned metal oxide layer, the method of the present invention may further comprise a step (F') after the step (E): modifying the patterned metal oxide layer to further change its characteristics, such as structure, conductivity, transparency etc., or to form a patterned metal layer, if it is needed.

According to the method for preparing a patterned carrier transport layer of a solar cell or a biomedical material of the present invention, the patterned metal/metal oxide layer is formed by applying the solution of the metal/metal oxide precursor, and followed by patterning and curing the metal/metal oxide precursor layer. Hence, it is possible to form the patterned metal/metal oxide layer with 3D structure (or network structure) in a simple way by using a nanoimprint technique and a curing process. When the patterned carrier transport layer prepared according to the method of the present invention is applied to a dye-sensitized solar cell, the totally reactive surface of the patterned carrier transport layer is increased, and, thereby, the photoelectric conversion efficiency can be improved. Also, when the patterned biomedical material is prepared according to the method of the present invention, not only the reaction surface of the biomedical material can be increased, but also the reactivity and applicability of the biomedical material can be increased. In addition, through an optional modification process, the structure of the metal/metal oxide layer can be changed, such as the metallic state can be modified into the oxidation state, the oxidation state can be modified into the metallic state, and the crystalline structure of the metal/metal oxide layer can be further changed etc. Therefore, it is possible to improve the function and the applicability of the patterned carrier transport layer or the patterned biomedical material by performing the optional modification process.

According to the methods for preparing a patterned carrier transport layer of a solar cell and a biomedical material of the present invention, the solution of the precursor may comprise: a metal precursor, or a metal oxide precursor. In addition, the solution of the precursor may further comprise: a surfactant, a solvent, a stabilizer, and an additive. The surfactant is not particularly limited, as long as the surfactant is a material which can help the metal/metal oxide material become well dissolved or suspended in a solvent. The specific example of the surfactant may be, but not limited to: polyoxyethylene alkyl ether, polyoxyethylene polyoxypylene glycol, polyoxyethylene polystyrylphenyl ether, and polydimethyl siloxane. In addition, the solvent is also not particularly limited, and can be any solvent generally used. For example, the solvent can be: alcohol, alkane, ether, cycloalkane, and other proper solvent. The specific example of the solvent may be, but not limited to: methanol, ethanol, isopropanol, butanol, ethylene glycol, hexane, heptane, cyclohexane, acetyl acetone, acetone, methyl ethyl ketone, methyl isobutyl ketone, toluene, benzene, and xylene.

According to the methods for preparing a patterned carrier transport layer of a solar cell and a biomedical material of the present invention, the metal/metal oxide precursor may be metal-chelates, metal-alcoholates, metal-estates, or any metal/metal oxide precursor existing in a liquid state. The specific example of the precursor may be, but not limited to: titanium isopropoxide (TTIP), tetraethoxy titanium, tetraethyl titanate, tetrabutyl titanate, and silver chloride.

Hence, when the solution of the precursor used in the method of the present invention comprises a titanium oxide precursor, a patterned titanium oxide layer can be obtained. Preferably, the patterned metal oxide layer is a nano-scaled patterned titanium oxide layer, which can be used as the carrier transport layer of the dye-sensitized solar cell. In addition, titanium has excellent biocompatibility, so the modified patterned titanium oxide layer (i.e. the patterned Ti layer) may also be used as a biomedical material such as a bioimplant.

According to the methods for preparing a patterned carrier transport layer of a solar cell and a biomedical material of the present invention, the patterned metal/metal oxide layer has a pattern of recesses and protrusions. The sizes of the recesses and the protrusions are not particularly limited, and depend upon the fields that applied to. Hence, the patterned metal/metal oxide layer can have a nano-scaled or a micro-scaled pattern. Preferably, the depth of the recesses is 1 nm~3 μm, and the width of the recesses is 3 nm~300 μm. More preferably, the depth of the recesses is 2 nm~1 μm, and the width of the recesses is 3 nm~10 μm.

In addition, according to the methods for preparing a patterned carrier transport layer of a solar cell and a biomedical material of the present invention, the precursor layer can be cured/pre-cured through an illuminating process, or a baking process in the step (D). Preferably, the precursor layer is cured through a baking process at high-temperature. The temperature of the baking process can be 50-600° C., and the baking time can be several seconds to several hours. Preferably, the baking time is 5 sec to 10 hrs. More preferably, the baking time is 10 min to 3 hrs.

According to the methods for preparing a patterned carrier transport layer of a solar cell and a biomedical material of the present invention, the patterned metal/metal oxide layer may be modified through any modification methods in the step (F) or (F'). The specific example of the modification method can be, but not limited to: a heat treatment, a plasma treatment, or a rapid thermal annealing. For example, the heat treatment can be performed on the cured/pre-cured precursor layer in vacuum, to change the structure of the precursor layer; or the patterned metal/metal oxide layer can be modified under a specific atmosphere. For example, titanium oxide can be reduced into titanium under $H_2$ atmosphere, silver oxide can be reduced into silver atom under $H_2$ atmosphere, and titanium can be oxidized into titanium oxide under $O_2$ atmosphere.

In addition, according to the methods for preparing a patterned carrier transport layer of a solar cell and a biomedical material of the present invention, the substrate can be coated with the solution of the precursor by spin coating, dip coating, roll coating, or printing in the step (B).

Hence, a patterned metal/metal oxide layer with large area can be obtained in a rapid and simple way through the methods for preparing a patterned carrier transport layer of a solar cell and a biomedical material of the present invention. In addition, a patterned metal/metal oxide layer with nano-scaled patterns can be obtained by use of the nanoimprint technique in the method of the present invention. Besides, the totally reactive surface of the carrier transport of the solar cell can be increased to improve the photoelectric conversion efficiency of the solar cell, and the reaction surface of the biomedical material can also be increased to improve the reactivity of the bioimplants, by using the patterned metal/metal oxide layer prepared according to the methods of the present invention. In addition, the structure of the metal oxide can be changed, or the metal oxide can be reduced to metal by an optional modification process, to increase the functionality and the applicability. Furthermore, a solar cell with high surface-to-volume ration of network structure can be prepared efficiently by adopting the method for preparing a patterned carrier transport layer of a solar cell of the present invention, in order to meet the requirement of large-reactive-area.

DETAILED DESCRIPTION OF THE PREFERRED EMBODIMENT

Hereinbelow, the present invention will be described in detail with reference to Embodiments. The present invention may, however, be embodied in many different forms and should not be construed as being limited to the Examples set forth herein. Rather, these Embodiments are provided to fully convey the concept of the invention to those skilled in the art.

Embodiment 1

Preparation of a Biomedical Material with a Patterned Metal Oxide Layer

Figure 1:
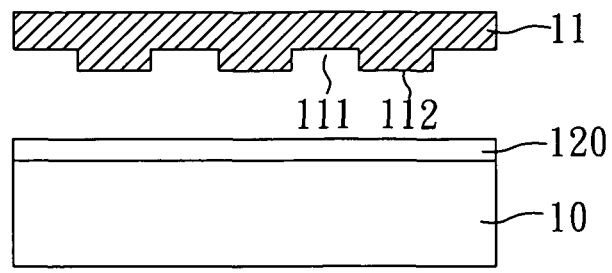
FIGS. 1A-1C are cross-sectional views illustrating the process of preparing a patterned biomedical material in Embodiment 1 of the present invention.
Figure 1:
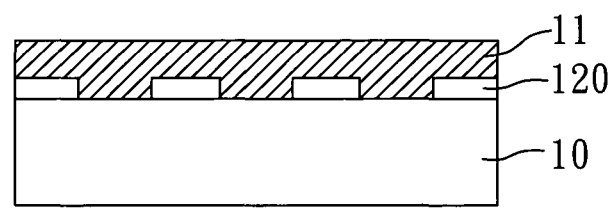
Figure 1:
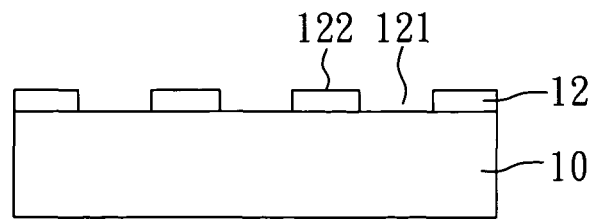

FIGS. 1A-1C are cross-sectional views illustrating the process of preparing a patterned biomedical material in the present embodiment.

First, a substrate 10 and a mold 11 were provided, wherein the mold 11 had a designed pattern of recesses 111 and protrusions 112, as shown in FIG. 1A.

Next, the substrate 10 was coated with a solution of a metal oxide precursor to form a metal oxide precursor layer 120, as shown in FIG. 1A. Herein, the solution of the metal oxide precursor comprised tetrabutyl titanate and ethanol.

As shown in FIG. 1B, the mold 11 was pressed onto the metal oxide precursor layer 120 to transfer the designed pattern of the mold 11 into the metal oxide precursor layer 120.

Then, the metal oxide precursor layer 120 was cured through a heat treatment. After the metal oxide precursor layer 120 was cured, the mold 11 was removed and a patterned metal oxide layer 12 was obtained, as shown in FIG. 1C. Herein, the patterned metal oxide layer 12 had a pattern corresponding to the designed pattern of the mold 11, i.e. the protrusions 122 of the patterned metal oxide layer 12 corresponded to the recesses 11 of the mold 21, and the recesses 121 of the patterned metal oxide layer 12 corresponded to the protrusions 112 of the mold 21. In addition, the width of the recesses 121 of the patterned metal oxide layer 12 prepared in the present embodiment was 10 nm. The solution of the metal oxide precursor used in the present embodiment was a solution containing $TiO_2$ particles. Therefore, the patterned metal oxide layer 12 prepared in the present embodiment was a nano-scaled patterned $TiO_2$ layer.

The metal oxide layer 12 prepared in the present embodiment is a nano-scaled patterned $TiO_2$ layer, which not only can be applied to biomedical field, but also can be used as a photocatalyst with excellent reactivity.

Embodiment 2

Preparation of a Patterned Carrier Transport of a Dye-Sensitized Solar Cell

Figure 2:
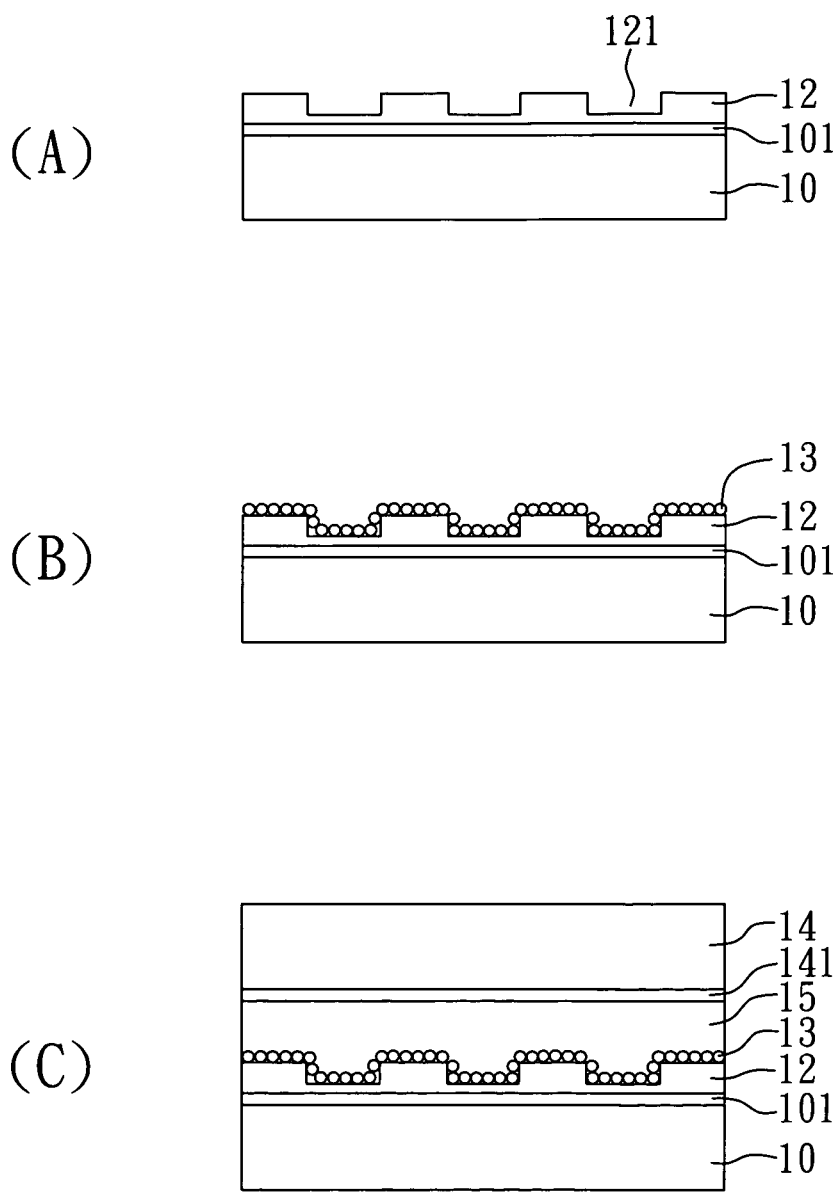
FIGS. 2A-2C are cross-sectional views illustrating the process of preparing a patterned carrier transport layer of a solar cell in Embodiment 2 of the present invention.

The process for preparing a patterned carrier transport of a solar cell was similar to that disclosed in Embodiment 1 and FIGS. 1A-1C, except that the substrate 10 was a glass substrate with a transparent oxide layer 101 formed thereon, and the depth of the recesses 121 was less than the thickness of the patterned metal oxide layer 12, as shown in FIG. 2A. Herein, the transparent oxide layer is an ITO thin film.

The solution of the metal oxide precursor used in the present embodiment is a solution containing $TiO_2$ particles. Therefore, the patterned metal oxide layer 12 formed in the present invention is a patterned $TiO_2$ layer.

After an imprinting process and a curing process were performed, the substrate 10 with the patterned metal oxide layer 12 of the present embodiment can be used as a carrier transport layer of a dye-sensitized solar cell.

In addition, a heat treatment can be performed on the patterned metal oxide layer, if it is needed. After the heat treatment, the ratio of the effective phase of the patterned carrier transport layer can be increased to enhance the photoelectric conversion efficiency, the patterned metal oxide layer 12 can be cured more completely, or defects in the patterned metal oxide layer 12 can be changed. Furthermore, the amounts of the doping atoms can be modified through a modification process to change the energy gap of the patterned $TiO_2$ layer.

Then, the substrate 10 with the patterned metal oxide layer 12 formed thereon was dipped into a dye solution containing ruthenium complex (not shown in the figure), and the dyes 13 can be absorbed on the patterned metal oxide layer 12, as shown in FIG. 2B.

As shown in FIG. 2C, another glass substrate 14 with a Pt thin film 141 formed thereon was provided and used as a cathode. Then, an electrolyte 15 was injected in the space between the substrate 10 with a patterned metal oxide layer 12 formed thereon and the glass substrate 14, and a thermoplastic polymer film (not shown in the figure) was used to seal the space defined. After the aforementioned process, a dye-sensitized solar cell of the present invention was obtained, as shown in FIG. 2C.

Embodiment 3

Preparation of a Biomedical Material with a Patterned Metal Layer

The process used in the present invention was similar to that disclosed in Embodiment 1, except that the following modification process was performed after the patterned metal oxide layer was obtained.

The patterned metal oxide layer (i.e. the patterned $TiO_2$ layer) was modified under $H_2$ atmosphere, to modify the patterned $TiO_2$ layer into a patterned Ti layer.

Ti has excellent biocompatibility, and the patterned Ti layer can further increase the surface area of the Ti layer to increase its bioactivity. Hence, the patterned Ti layer prepared in the present embodiment can increase its applicability, when it is used as a biomedical material.

Embodiment 4

Preparation of a Biomedical Material with a Patterned Metal Layer

The process used in the present invention was similar to that disclosed in Embodiment 1, except that tetrabutyl titanate was substituted with $AgCl_2$, and a patterned $AgCl_2$ layer was obtained.

In addition, after the patterned $AgCl_2$ layer was formed, a modification process was performed on the patterned $AgCl_2$ layer under $H_2$ atmosphere, and a nano-silver thin film with a designed pattern was obtained.

It is known that nano-scaled silver has excellent anti-bacteria activity. Hence, the nano-pattern-composing silver thin film with the designed pattern obtained in the present embodiment can be used as an anti-bacterial material for a biomedical application.

In conclusion, according to the methods for preparing a patterned carrier transport layer of a solar cell and a biomedical material of the present invention, a patterned metal/metal oxide layer can be obtained by using a simple nanoimprinting process, without using a complex etching process. In addition, the method for preparing a patterned carrier transport layer of a solar cell of the present invention may further form a patterned metal oxide layer with large area to meet the requirement of the large area solar cell. Furthermore, through a modification process, the metal oxide layer can be modified into a metal layer, or the metal layer can be modified into a metal oxide layer to increase its function and applicability.

Although the present invention has been explained in relation to its preferred embodiment, it is to be understood that many other possible modifications and variations can be made without departing from the scope of the invention as hereinafter claimed.

What is claimed is:

1. A method for preparing a patterned carrier transport layer of a solar cell, comprising the following steps:
   (A) providing a substrate, and a mold with designed patterns formed thereon;
   (B) coating the substrate with a solution of a precursor to form a precursor layer, wherein the precursor is a metal precursor;
   (C) pressing the mold onto the precursor layer to transfer the designed patterns of the mold into the precursor layer;
   (D) curing the precursor layer;
   (E) removing the mold to obtain a patterned carrier transport layer, wherein the patterned carrier transport layer is a patterned metal layer; and
   (F) modifying the patterned metal layer to form a patterned metal oxide layer.

2. The method as claimed in claim 1, wherein the metal of the metal precursor is titanium.

3. The method as claimed in claim 1, wherein the precursor is isopropoxytitanium oxide, tetra isopropyl titanate, tetraethyl titanate, tetrabutyl titanate, or silver chloride.

4. The method as claimed in claim 1, wherein the patterned carrier transport layer comprises a nano-scaled pattern with recesses.

5. The method as claimed in claim 4, wherein the width of the recesses is 3 nm~300 μm.

6. The method as claimed in claim 1, wherein the precursor layer is cured through an illuminating process, or a baking process in the step (D).

7. The method as claimed in claim 1, wherein the patterned metal layer is modified through a heat treatment, a plasma treatment, or a rapid thermal annealing in the step (F).

8. A method for preparing a patterned carrier transport layer of a solar cell, comprising the following steps:
   (A) providing a substrate, and a mold with designed patterns formed thereon;
   (B) coating the substrate with a solution of a precursor to form a precursor layer, wherein the precursor is a metal oxide precursor;
   (C) pressing the mold onto the precursor layer to transfer the designed patterns of the mold into the precursor layer;
   (D) curing the precursor layer;
   (E) removing the mold to obtain a patterned carrier transport layer, wherein the patterned carrier transport layer is a patterned metal oxide layer; and
   (F') modifying the patterned metal oxide layer to form a patterned metal layer.

9. The method as claimed in claim 8, wherein the patterned metal oxide layer is modified through a heat treatment, a plasma treatment, or a rapid thermal annealing in the step (F').

10. The method as claimed in claim 8, wherein the metal of the metal oxide precursor is titanium.

11. The method as claimed in claim 8, wherein the precursor is isopropoxytitanium oxide, tetra isopropyl titanate, tetraethyl titanate, or tetrabutyl titanate, or silver chloride.

12. The method as claimed in claim 8, wherein the patterned carrier transport layer comprises a nano-scaled pattern with recesses.

13. The method as claimed in claim 11, wherein the width of the recesses is 3 nm~300 μm.

14. The method as claimed in claim 8, wherein the precursor layer is cured through an illuminating process, or a baking process in the step (D).

* * * * *